United States Patent
Lin et al.

(10) Patent No.: US 8,912,581 B2
(45) Date of Patent: Dec. 16, 2014

(54) 3D TRANSMISSION LINES FOR SEMICONDUCTORS

(75) Inventors: Yu-Ling Lin, Taipei (TW); Hsiao-Tsung Yen, Tainan (TW); Feng Wei Kuo, Zhudong Township, Hsinchu County (TW); Ho-Hsiang Chen, Hsinchu (TW); Chin-Wei Kuo, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 56 days.

(21) Appl. No.: 13/415,906

(22) Filed: Mar. 9, 2012

(65) Prior Publication Data

US 2013/0234305 A1    Sep. 12, 2013

(51) Int. Cl.
| | | |
|---|---|---|
| *H01L 29/80* | (2006.01) | |
| *H01L 39/00* | (2006.01) | |
| *H01L 29/40* | (2006.01) | |
| *H01L 23/60* | (2006.01) | |

(52) U.S. Cl.
CPC .................................... *H01L 23/60* (2013.01)
USPC ............................ 257/259; 257/662; 257/664

(58) Field of Classification Search
CPC ........................................................ H01L 23/60
USPC ........................................ 257/664, 259, 662
See application file for complete search history.

(56) References Cited

U.S. PATENT DOCUMENTS

| | | | |
|---|---|---|---|
| 6,525,407 B1* | 2/2003 | Drewery ....................... 257/666 |
| 2007/0252177 A1* | 11/2007 | Cuchet et al. ................. 257/259 |
| 2012/0119378 A1* | 5/2012 | Ng et al. ....................... 257/774 |

\* cited by examiner

*Primary Examiner* — Luan C Thai
(74) *Attorney, Agent, or Firm* — Duane Morris LLP

(57) ABSTRACT

A transmission line structure for semiconductor RF and wireless circuits, and method for forming the same. The transmission line structure includes embodiments having a first die including a first substrate, a first insulating layer, and a ground plane, and a second die including a second substrate, a second insulating layer, and a signal transmission line. The second die may be positioned above and spaced apart from the first die. An underfill is disposed between the ground plane of the first die and the signal transmission line of the second die. Collectively, the ground plane and transmission line of the first and second die and underfill forms a compact transmission line structure. In some embodiments, the transmission line structure may be used for microwave applications.

25 Claims, 12 Drawing Sheets

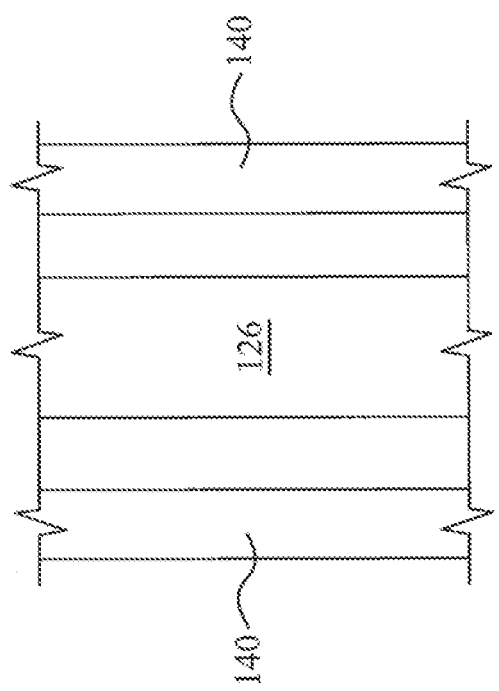

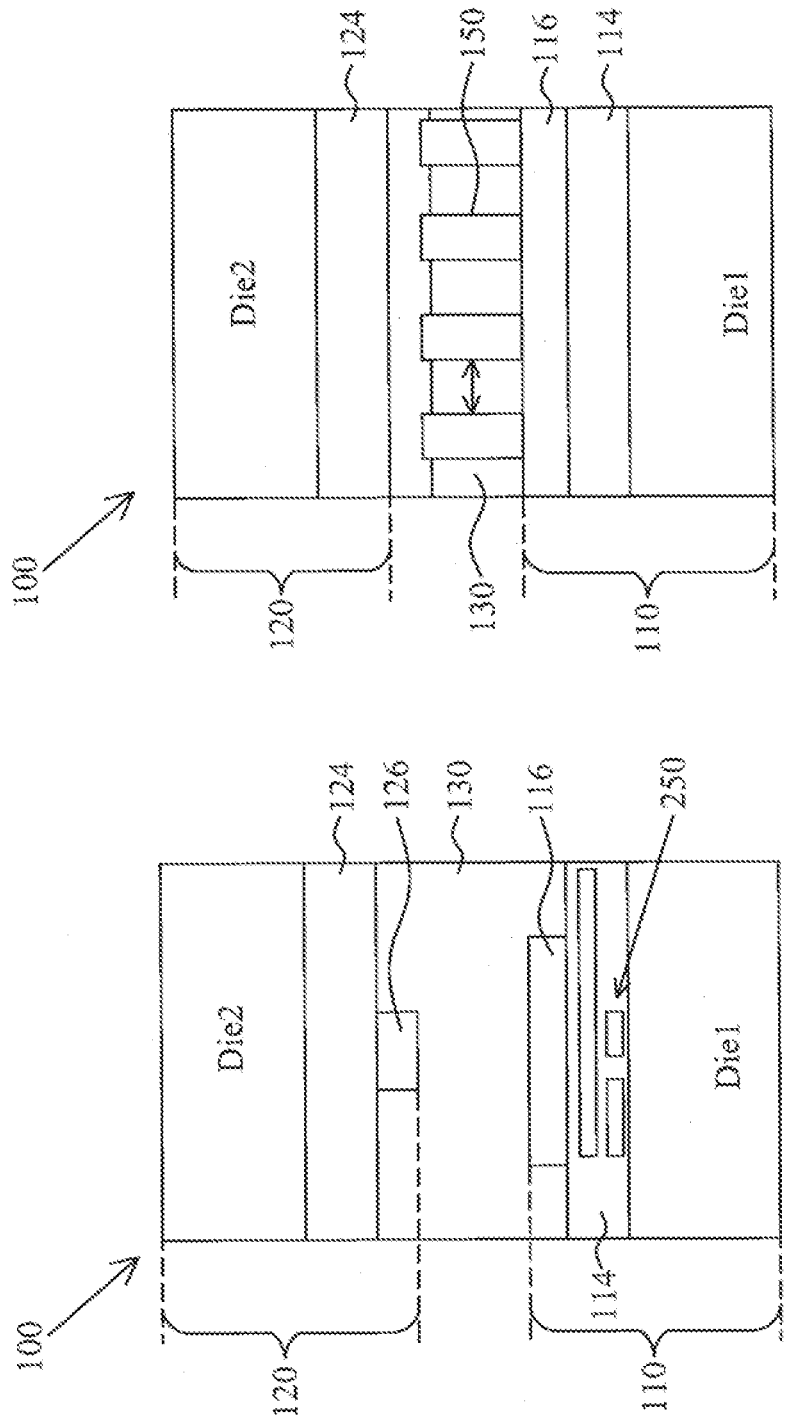

3D TRANSMISSION LINES FOR SEMICONDUCTORS

FIELD

The present disclosure generally relates to semiconductors structures, and more particularly to conductive transmission lines for semiconductor structures and method for forming the same.

BACKGROUND

Semiconductor packages equipped with wireless data and communication systems incorporate various RF (radio frequency) transmitting structures, which sometimes are built on-chip or in-package. RF signals are generally considered to have a frequency falling in approximately the 3 kHz to 300 GHz range, with frequencies in the domain between about 300 MHz (0.3 GHz) and 300 GHz typically being referred to as microwaves. Electromagnetic RF waves or signals are conveyed through the semiconductor packages or devices by conductive structures referred to as "transmission lines." Transmission lines, as an example, are used for interconnecting individual electrical elements together in a Monolithic Microwave Integrated Circuit (MMIC), and for interconnecting MMICs together within microwave MultiChip Modules (MCMs).

In general, a microwave transmission line structure generally includes at least two electric conductors or lines wherein one of the lines forms a ground (also referred to as "ground plane") and the other forms a signal transmission line. The signal transmission line is variously arranged and combined with one or more ground planes or ground lines to form different types of conductive transmission line structures such as microstrips, striplines, and waveguides to serve various RF signal applications. The transmission lines and ground conductors or planes are generally supported by some type of insulating substrate or material such as a dielectric.

As semiconductor technology continues to advance and chip package size shrinks, such as by employing 3D die stacking, the distance between metal layers in the conductive CMOS (complementary metal-oxide semiconductor) structure becomes smaller resulting in increasingly larger capacitance between the metal layers which compromises performance of RF devices. In addition, designing and fabricating transmission line structures on-chip in a single chip or die becomes increasingly difficult with shrinking die packages in advanced semiconductor manufacturing technology nodes like the 20 nm process.

BRIEF DESCRIPTION OF THE DRAWINGS

The features of the various embodiments will be described with reference to the following drawings where like elements are labeled similarly, and in which:

FIG. 14 shows a partial top view of the transmission line structure of FIG. 4 taken along line 14-14 in FIG. 4.

FIG. 15 is a cross-sectional side view of another embodiment of a transmission line structure having metal interconnect routings in the die beneath the ground plane; and FIG. 16 is a cross-sectional longitudinal side view of the transmission line structure of FIG. 4 having a plurality of microbumps interconnecting between the signal transmission line and ground plane.

Figure 1:
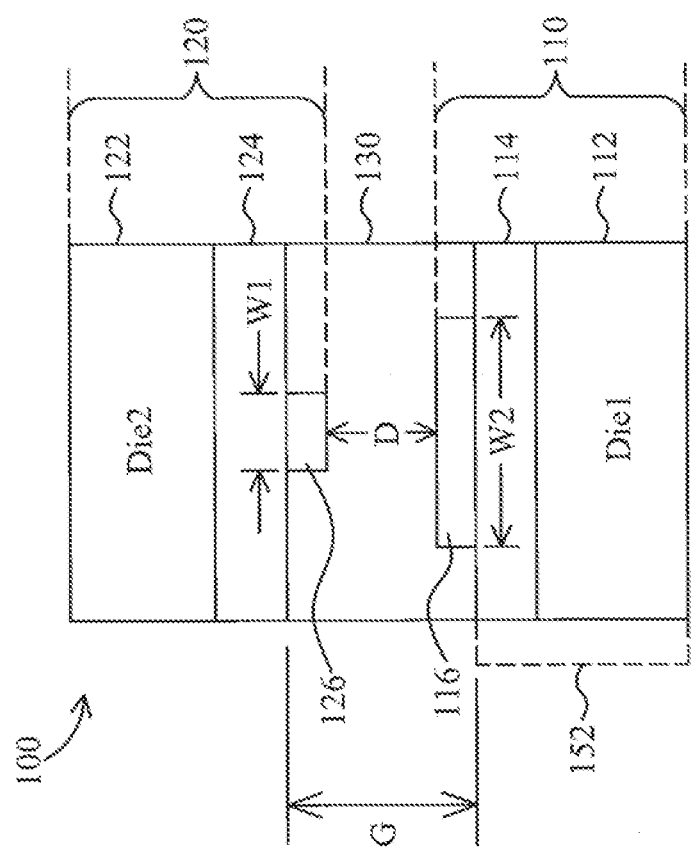
FIG. 1 is a cross-sectional side view of a first embodiment of a transmission line structure according to the present disclosure.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components. Moreover, the features and benefits of the present disclosure are illustrated by reference to the preferred embodiments. Accordingly, the present disclosure expressly should not be limited to such embodiments illustrating some possible non-limiting combination of features that sometimes exist alone or in other combinations of features; the scope of various embodiment of the disclosure being defined by the claims appended hereto.

FIG. 1 shows a first embodiment of a semiconductor transmission line structure 100 according to the present disclosure formed by using 3D vertical die stacking involving coupling two dies together. In some embodiments, the transmission line structure 100 is a microstrip useful for conveying microwave frequency signals. Transmission line structure 100 includes a first chip or die 110 and a second chip or die 120.

Die 110 includes an electrical insulator layer such as dielectric layer 114 deposited on die substrate 112. Die substrate 112 is a CMOS substrate in some embodiments and includes active devices such as transistors, capacitors, resistors, etc. patterned and formed in the substrate by methods. In some embodiments, substrate 122 is made of silicon. In other embodiments, substrate 122 is made of a semi-insulating or high resistivity (HR) substrate material such as, without limitation, silicon carbide.

Dielectric layer 114 is a metal-containing interconnect layer in various embodiments including multiple layers of inter-metal dielectric (IMD) combined with conductive traces/routings and structures to interconnect various devices formed on substrate 112 and create the desired circuits. These interconnect structures include vias, trenches, plugs, and other similar structures formed by BEOL (back end of line) processes such as, without limitation, damascene and dual damascene involving patterned photolithography, film deposition, etching, planing, etc. Accordingly, in some embodiments, layer 114 includes several metal layers such as first level metal M1, second level metal M2, etc. and first level via V1, second level via V2, etc. which interconnect the metal layers. The metal conductive interconnect structures in some embodiments are formed of copper, aluminum, tungsten, titanium, and other suitable electrically conductive materials. Dielectric layer 114 in some embodiments therefore are comprised of the individual IMD layers formed and interspersed between the metal layers and are made of any suitable electrically insulating IMD material such as, without limitation, silicon dioxide (SiO2), low-k dielectric materials such as Black Diamond from Applied Materials, Inc., USG, FSG and others.

Die 110 further includes a first conductive transmission line such as ground plane 116 formed on or in and supported by dielectric layer 114. In some embodiments, ground plane 116 is formed in the top metal layer in interconnect dielectric layer 114 as shown in FIG. 1. At least the top surface of ground plane 116 is exposed above the top dielectric layer 114 material in some embodiments.

Ground plane 116 is formed of a suitable metallic conductor which is sputtered or plated onto dielectric layer 114 and etched by any suitable fabrication processes to define a desired configuration or pattern for the ground plane. In some embodiments, the metallic conductor material is copper. The metal conductive interconnect structures may also be formed of aluminum, tungsten, titanium, (AP, Cu, poly, OD, metal gate) and other suitable electrically conductive materials.

With continuing reference to FIG. 1, die 120 is structured similarly to die 110 in some embodiments and includes an electrical insulator such as dielectric layer 124 deposited on die substrate 122. Die substrate 122 is a CMOS substrate in various embodiments. In some embodiments, substrate 122 is made of silicon. In other embodiments, substrate 122 is made of a semi-insulating or high resistivity (HR) substrate material such as without limitation silicon carbide.

Dielectric layer 124 is a metal interconnect layer in some embodiments similar to dielectric layer 114 including multiple layers of inter-metal dielectric (IMD) and conductive traces or structures formed therein to interconnect the various devices formed on substrate 122 and create the desired circuits. Dielectric layer 124 is formed by any suitable electrically insulating dielectric material similar to dielectric layer 114.

Die 120 further includes a second conductive transmission line such as signal transmission line 126 formed on or in and supported by dielectric layer 124. In some embodiments, signal transmission line 126 is formed in the top metal layer in interconnect dielectric layer 124 as shown in FIG. 1. At least the top surface of signal transmission line 126 is exposed above the top dielectric layer 124 material in some embodiments.

In some embodiments, signal transmission line 126 is formed of a suitable metallic conductor which is sputtered or plated onto dielectric layer 124 and etched by any suitable fabrication processes to define a desired configuration or pattern for the signal line. In some embodiments, the metallic conductor material may be copper. In some embodiments, the metal conductor is formed of aluminum, tungsten, titanium, (AP, Cu, poly, OD, metal gate) and other suitable electrically conductive materials.

Referring to FIG. 1, ground plane 116 and signal transmission line 126 are disposed on a surface of dielectric layers 114, and 124 respectively as shown. In other embodiments, ground plane 116 and signal transmission line 126 are partially or fully embedded in dielectric layers 114, and 124 (see, e.g. FIGS. 10-13).

In some embodiments, one of dies 110, 120 is inverted in orientation and positioned with respect to the other die as shown in FIG. 1. In the embodiment shown, die 120 is inverted. Dies 110 and 120 can therefore be arranged such that ground plane 116 and signal transmission line are in opposing, but spaced apart relationship separated by a vertical gap G as shown in FIG. 1 with ground plane 116 and signal transmission line 126 being spaced apart and separated by a distance or depth D as further shown in FIG. 2. In some embodiments, dies 110 and 120 are held in spaced relationship by any suitable means such as a fixture.

Figure 2:
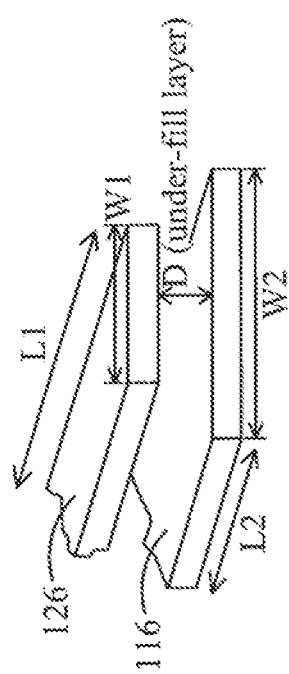
FIG. 2 is a perspective view of the transmission line structures of FIG. 1 disembodied from the insulating layers and underfill for clarity.

Referring to FIGS. 1 and 2, gap G between dies 110 and 120 is filled by injecting an underfill 130 into the gap which has electrical insulating properties. Underfill 130 bonds dies 110 and 120 together, and in some embodiments therefore has liquid properties allowing the underfill to flow uniformly via capillary action between the dies, ground plane 116, signal transmission line 126, microbumps 150 (see, e.g. FIG. 4), and any other structures formed between the opposing die top surfaces. The underfill 130 may then be cured and hardened after placement by any suitable means including heat and/or ultraviolet light depending on the underfill material selected. Underfill 130 is made of any suitable material. In one embodiment, underfill 130 is made of a dielectric material such as an inter-layer dielectric (ILD) type material. In one embodiment, underfill 130 is a made of SiO2 having a dielectric constant Er of about 3.9. In some other possible embodiments, underfill 130 is made of without limitation fused silica (SiO2), alumina (Al2O3), epoxy or boron nitride (BN).

Reference is again to FIG. 1 and also FIG. 2 showing disembodied perspective views of the signal transmission line 126 and ground plane 116. The signal transmission line 126 has a lateral width W1 and a longitudinal length L1 with the width W1 being the shortest dimension. Ground plane 116 has a lateral width W2 and longitudinal length L2. In some embodiments, it is desirable for performance of the transmission line that width W2 of ground plane line 116 to be at least 1.5 times width W1 of signal transmission line 126. For optimum performance, it is further desirable that W2 be approximately 2 times width W1 in some embodiments.

Figure 3:
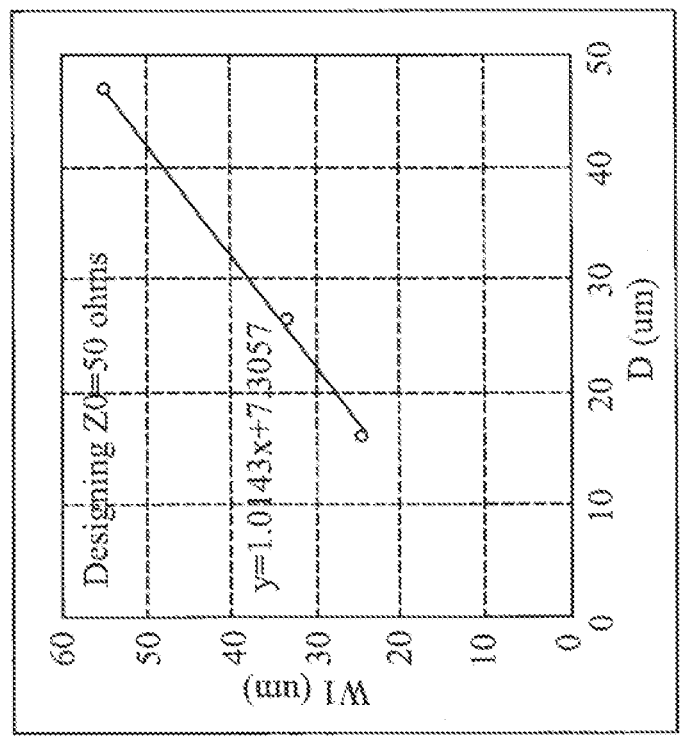
FIG. 3 is a graph showing the relationship between the width of the signal transmission line of FIG. 2 and depth of the underfill between transmission line and ground plane in one embodiment.

Width W1 is dependent on the distance or depth D between ground plane line 116 and signal transmission line 126, which is filled with underfill 130 in some embodiments. For example, without limitation, designing for a characteristic impedance $Z_0$=50 ohms, a graph is included in FIG. 3 showing the relationship between W1 and D using an underfill 130 having a dielectric constant of 3.9. As depth D increases, the corresponding width W1 of signal transmission line 126 increases. According, using the graph or formula y=1.1143X+7.3057 shown, the width W1 of signal transmission line 126 should ideally be approximately 27.6 microns for a depth D of 20 microns. In some embodiments, the depth D of underfill 130 is between about 10 microns and 50 microns as shown in FIG. 3. The depth D is affected by the dielectric constant of the underfill used.

In some embodiments, for illustration only without limitation, signal transmission line 126 and ground plane 116 may have a thickness of about 0.5-2 microns.

Referring to FIG. 1, it will be appreciated that in some embodiments, dies 110 or 120 may instead be replaced by a substrate formed by a silicon or HR interposer 152 (identified by dashed line bracket in FIG. 1) depending on the 3D chip packaging configuration used for a particular application. Accordingly, either the die substrate 112 or 122 and corresponding dielectric insulating layer 114 or 124 respectively is replaced by the interposer. Ground plane 116 or signal transmission line 126 is disposed on or in the interposer with the conductor not disposed in the interposer being formed in die 110 or 120 as shown in FIG. 1. In this embodiment, the interposer and one of the dies 110, 120 would form the 3D stacked transmission line structure. It will therefore be further appreciated that any of the conductive transmission line structures described herein are capable of being variously formed in either the dies 110, 120 or interposer in some embodiments.

Figure 4:
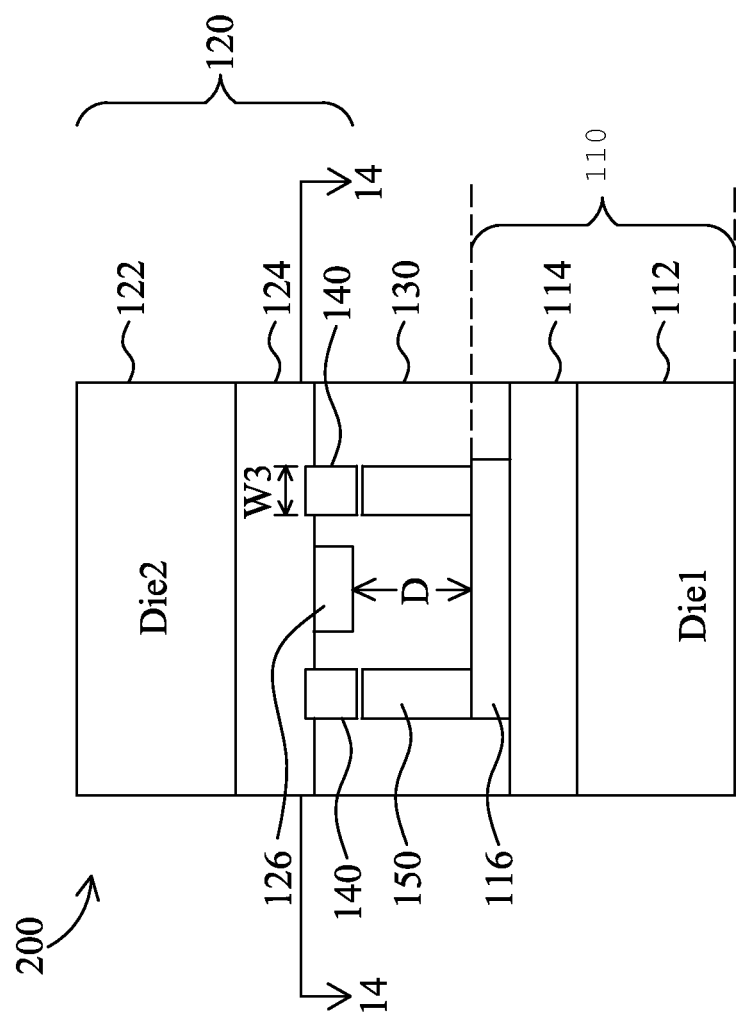
FIG. 4 is a cross-sectional side view of another embodiment of a transmission line structure.

FIG. 4 shows a second embodiment of a semiconductor transmission line structure 200 according to the present disclosure which is formed by using 3D vertical die stacking involving coupling two dies together. In some embodiments, the transmission line structure 200 is a grounded coplanar waveguide (GCPW) as shown which is useful for conveying microwave frequency signals. Transmission line structure 200 is generally similar to microstrip structure 100 described herein and includes dies 110 and 120 each having the same structures already described including ground plane 116 and signal line 126 lying in different planes of the transmission line structure.

For a waveguide, transmission line structure 200 further includes an additional pair of opposing ground lines or strips 140 with a ground strip being formed on either lateral side of the center signal transmission line 126 as shown in FIGS. 4 and 14; the latter figure being a top view of ground strip and transmission line structure of FIG. 4. Ground strips 140 lie in the same plane as signal transmission line 126 and are coplanar with the transmission line as shown. Ground strips 140 are spaced apart horizontally from the signal transmission line 126 for electrical isolation, which in some embodiments is provided by the electrically insulating underfill 130 material deposited in the gap formed between the ground strips 140 and transmission line. Ground strips 140 are formed on or in die 120 similarly to signal transmission line 126 already described herein and are supported by die 120, and in some embodiments are disposed on top of dielectric layer 124. In some embodiments, ground lines follow and are routed generally parallel to signal transmission line 126 as is typical in waveguide structures. Ground strips 140 have a lateral width W3 which is substantially smaller than width W2 of ground planes 116 or 160 (shown in FIGS. 5 and 6) in some embodiments. In various embodiments, width W3 is smaller than or approximately the same as width W1 of signal transmission line 126.

With continuing reference to FIG. 4, in some embodiments, ground plane 116 is electrically coupled to ground strips 140 by microbumps 150 as shown in this embodiment. Microbumps 150 shield signal transmission line 126 to prevent lateral or side signal leakage if other conductive structures may be provided which are located approximately 10 microns or less away (horizontally) from the signal transmission line. To provide effective shielding the microbumps 150 extend between the ground strips 140 and ground plane 116 along the length of the ground strips and plane (i.e. into and perpendicular to the page in FIG. 4, as best shown in the cross-sectional side view in FIG. 16 showing a row or array of microbumps). The microbumps 150 are horizontally and laterally spaced apart as shown in the embodiment of FIG. 16. In other embodiments, it will be appreciated that microbumps 150 can be omitted depending on the intended waveguide structure desired and/or proximity of other conductive structures from signal transmission line 126.

Microbumps 150 are made of any suitable conductive metal or metal alloy commonly used for solder microbumps. In some embodiments, microbumps 150 are made of Cu, CuSn, SnZn, and other suitable materials or combinations of materials. Microbumps 150 are formed by any suitable MEMS (microelectromechanical systems) or semiconductor fabrication processes known in the art for forming solder microbumps and bumps. Such processes include, for example without limitation, evaporation, electroplating, printing, and stud bumping.

Figure 5:
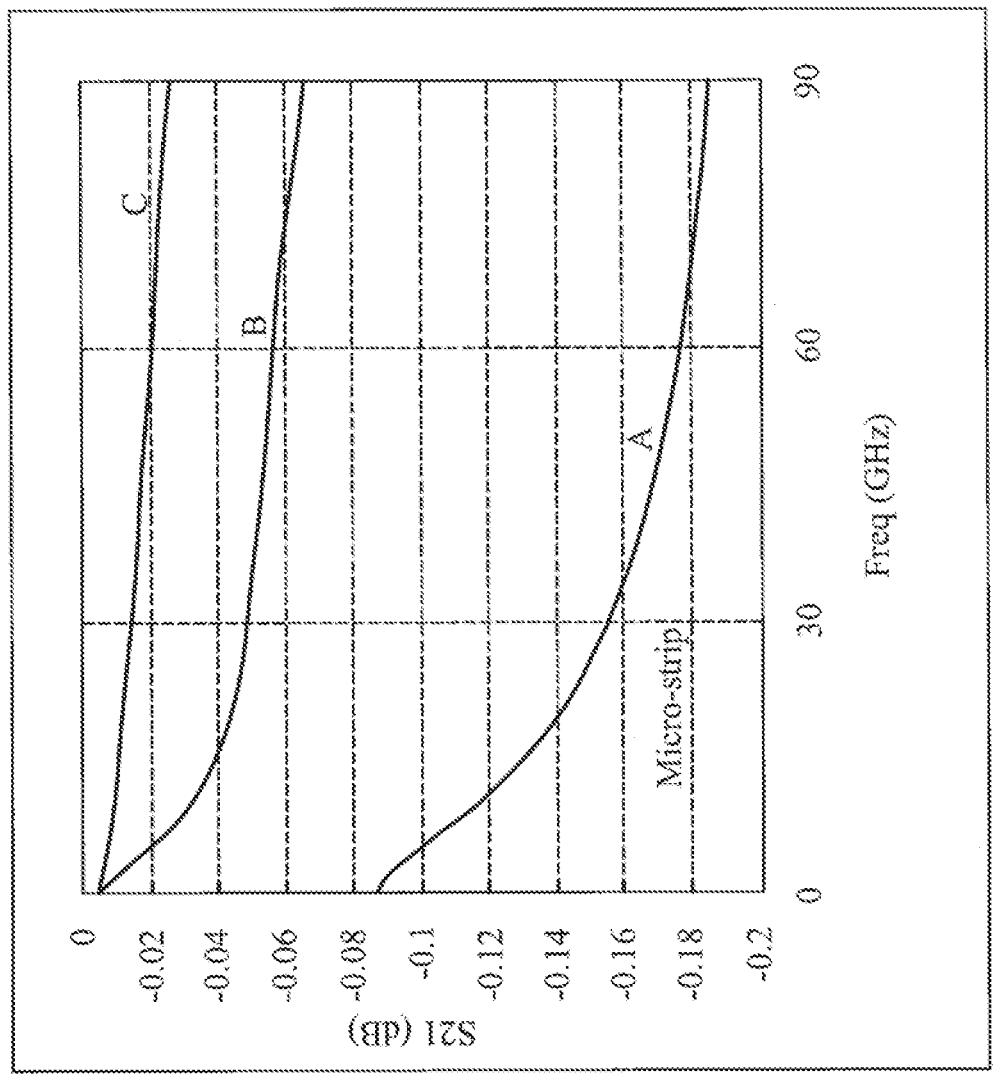
FIG. 5 is a graph comparing the S21 insertion loss (forward voltage gain) performance for the transmission line structures FIG. 1.
Figure 6:
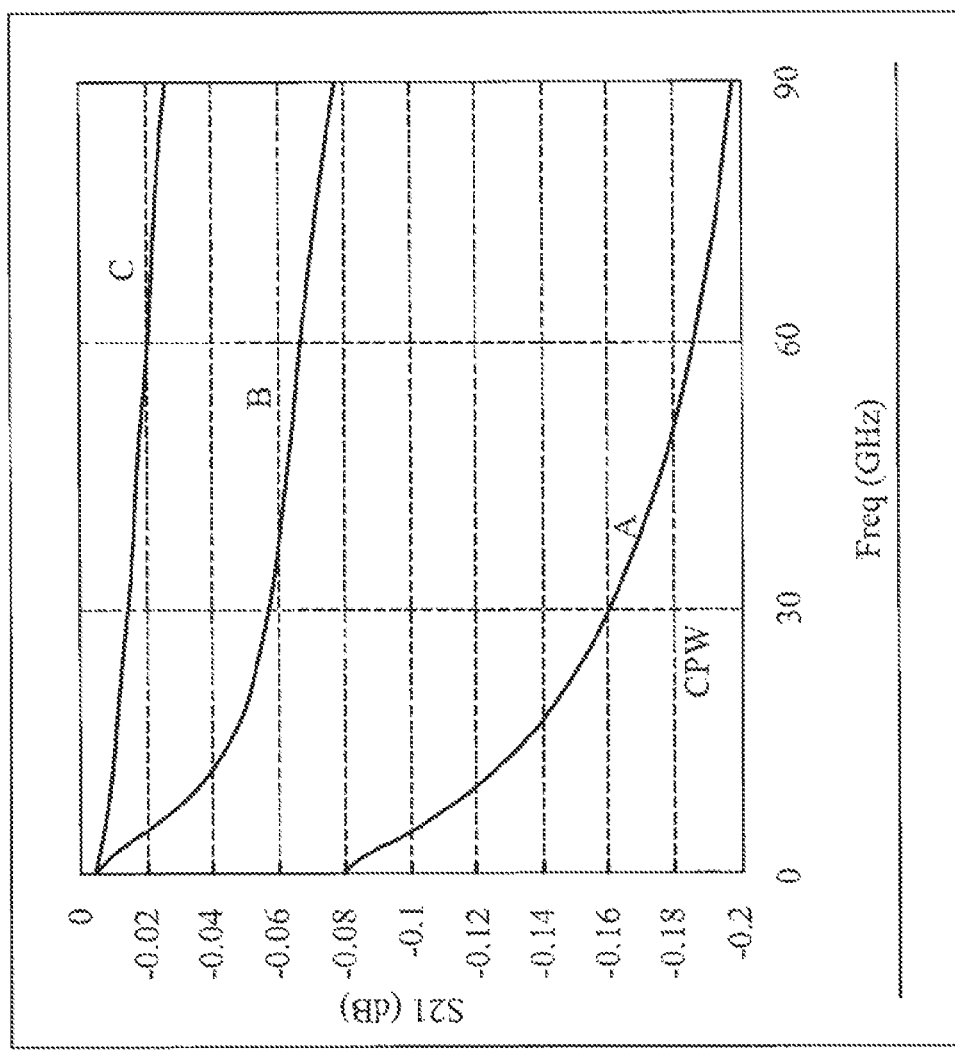
FIG. 6 is a graph comparing the S21 insertion loss (forward voltage gain) performance for the transmission line structures FIG. 4.

FIGS. 5 and 6 depict graphs comparing S21 insertion loss performance for the transmission line structures 100 and 200 of FIGS. 1 and 4, respectively. S21 is a scattering parameter or "S-parameter" related to forward voltage gain in an electrical network and a known measurement in the art. S-parameters describe the electrical behavior of linear electrical networks when subjected to various steady state stimuli created by electrical signals. Both graphs are based on a 90 micron length signal transmission line. Curve A in FIG. 5 shows the insertion loss at different microwave frequencies for an embodiment of a microstrip wherein the ground plane 116 and signal transmission line 126 are formed in the dielectric interconnect metal layer of a single die. Curve B in FIG. 5 shows the insertion loss for the microstrip transmission line structure 100 of FIG. 1 wherein the ground plane 116 and signal transmission line 126 are formed in two different and separate dies 110, 120 which are packaged together with an underfill 130 therebetween. The substrates 112 and 122 are each made of basic silicon. Curve C in FIG. 5 shows the insertion loss for the microstrip transmission line structure 100 of FIG. 1 wherein the ground plane 116 and signal transmission line 126 are formed in two different and separate dies 110, 120 which are packaged together with an underfill 130 therebetween. In contrast to curve B, one of the substrates such as substrate 122 in which the signal transmission line 126 is formed is made of High Resistivity silicon.

As shown in FIG. 5, the S21 insertion loss parameter in Curves B and C for duo-chip or die microstrip transmission line structure 100 formed according to embodiments of the present disclosure is advantageously less than losses associated with the single die microstrip embodiment represented by Curve A.

Curve A in FIG. 6 shows the insertion loss at different microwave frequencies for an embodiment of a grounded coplanar waveguide (GCPW) structure 200 wherein the ground plane 116 and signal transmission line 126 are formed in the dielectric interconnect metal layer of a single die. Curve B in FIG. 6 shows the insertion loss for the GCPW structure 200 of FIG. 4 wherein the ground plane 116 and signal transmission line 126 are formed in two different and separate dies 110, 120 which are packaged together with an underfill 130 therebetween. The substrates 112 and 122 are each made of basic silicon. Curve C in FIG. 6 shows the insertion loss for the GCPW structure 200 of FIG. 4 wherein the ground plane 116 and signal transmission line 126 are formed in two different and separate dies 110, 120 which are packaged together with an underfill 130 therebetween. In contrast to curve B, one of the substrates such as substrate 122 in which the signal transmission line 126 is formed is made of High Resistivity silicon.

Similarly to FIG. 5, the S21 insertion loss parameter in Curves B and C of FIG. 6 for duo-chip or die GCPW structure 200 formed according to embodiments of the present disclosure is advantageously less than losses associated with the single die GCPW embodiment represented by Curve A. The improvement in insertion loss S21 performance in both FIGS. 5 and 6 is attributed at least in part to the ability to provide greater distance D between the ground plane 116 and signal transmission line 126 (see also FIG. 2) in the transmission line structures of FIGS. 1 and 4. The distance D is approximately 20-40 microns in some embodiments in contrast to a comparable distance D for the single die embodiment (Curves A in FIGS. 5 and 6) wherein D is less than 20 microns, generally on the order of about 1.5 microns for the 20 nm technology node.

Figure 7:
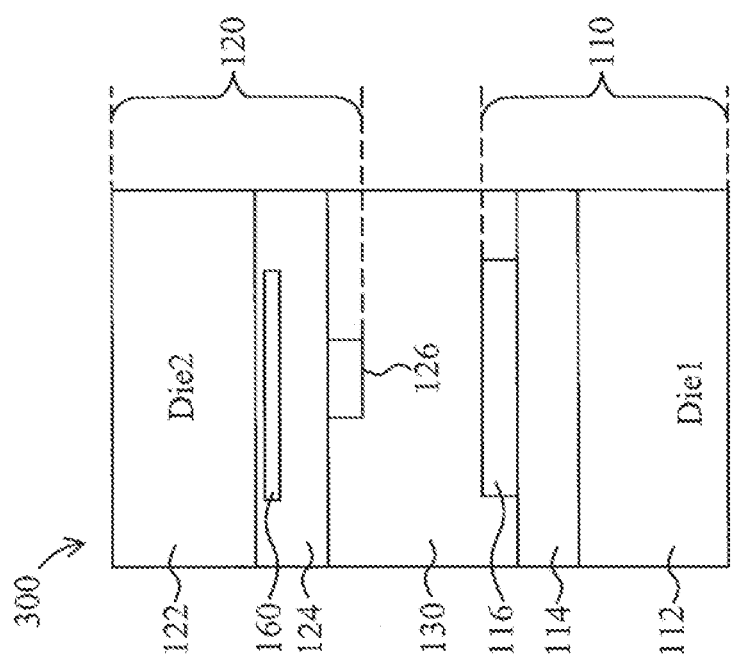
FIG. 7 is a cross-sectional side view of another embodiment of a transmission line structure.

FIG. 7 shows a third embodiment of a semiconductor transmission line structure 300 according to the present disclosure which is formed by using 3D vertical die stacking involving coupling two dies together. In some embodiments, as shown in FIG. 7, the transmission line structure 300 is a stripline which has two vertically spaced apart groundplanes (i.e. one above and below signal transmission line 126) for conveying microwave frequency signals. Transmission line structure 300 is similar to microstrip structure 100 described herein and includes dies 110 and 120 each having the same basic structures already described including ground plane 116 and signal line 126 lying in different planes of the transmission line structure. The stripline structure of FIG. 7, however, includes the second ground plane 160 formed in die 120 as shown. Second ground plane 160 is formed in the same dielectric layer 124 as signal transmission line 126 and is spaced vertically apart from the signal transmission line 126. In some embodiments, for example, second ground plane 160 is formed in the first metal layer M1 of dielectric layer 124 and signal transmission line 126 is formed in the top metal layer or on the top surface of dielectric layer 124. Ground plane 160 of die 120 may have a lateral width similar to width W2 of ground plane 116 of die 110 and be wider than width W1 of signal transmission line 126.

Figure 8:
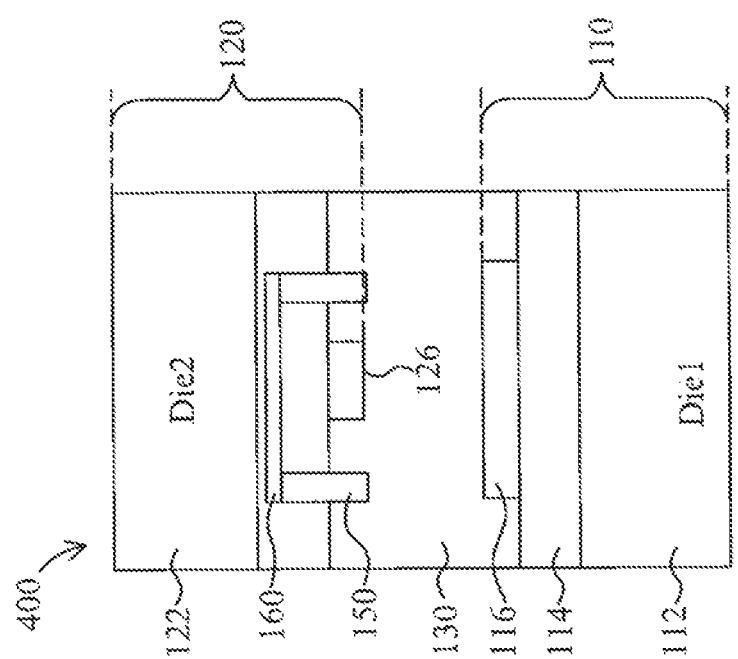
FIG. 8 is a cross-sectional side view of another embodiment of a transmission line structure.

FIG. 8 shows an embodiment of a transmission line structure 400 which is variation of the stripline embodiment of FIG. 7 which includes a microbump 150 formed on either side of signal transmission line 126 and connected to second ground plane 160 to electrically shield the signal transmission line from laterally proximate conductors in die 120.

Figure 9:
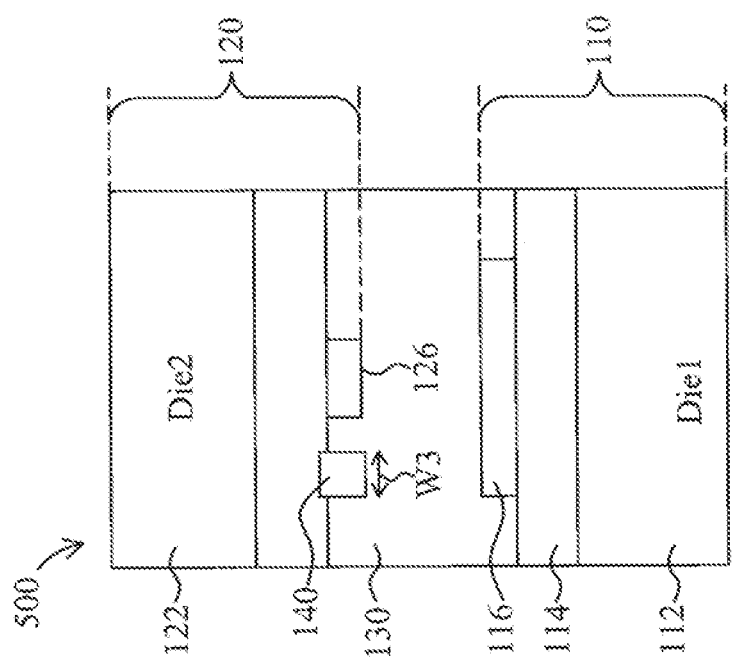
FIG. 9 is a cross-sectional side view of another embodiment of a transmission line structure.
Figure 10:
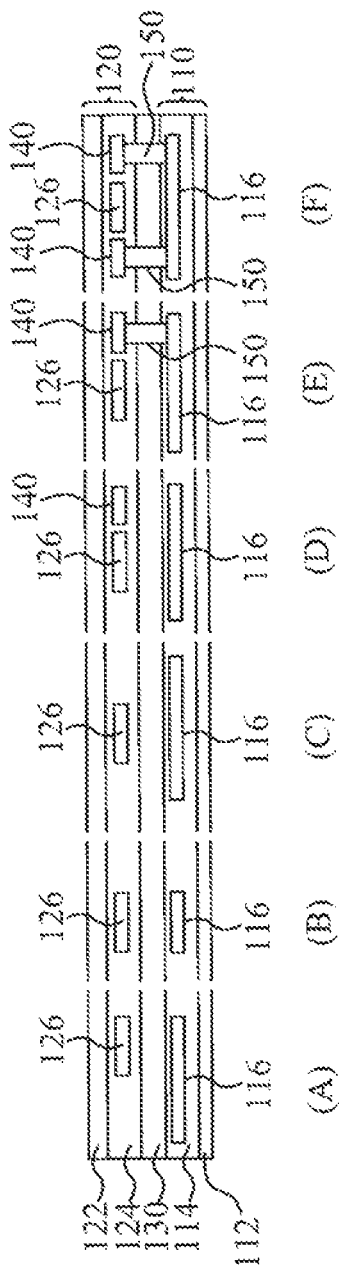
FIG. 10 shows six different possible embodiments of a transmission line structure according to the present disclosure.
Figure 11:
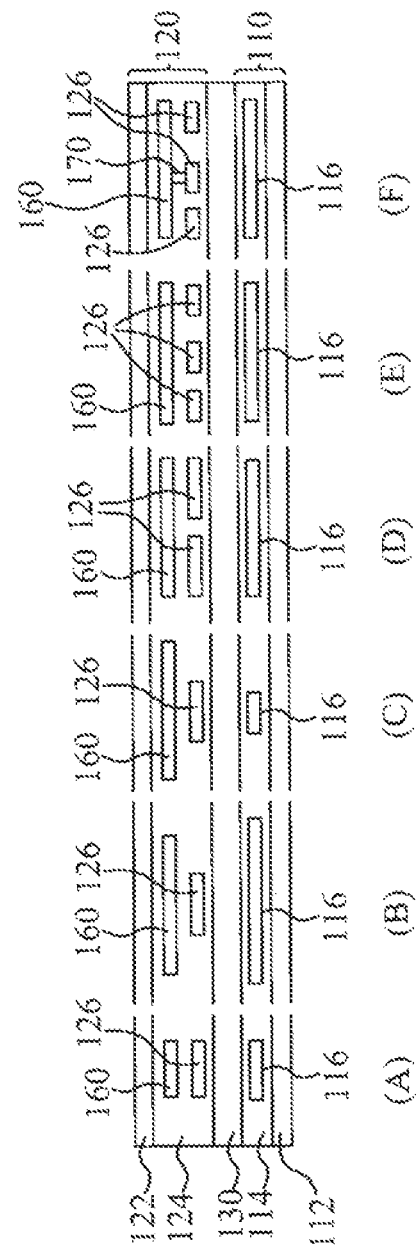
FIG. 11 shows six different possible embodiments of a transmission line structure according to the present disclosure.
Figure 12:
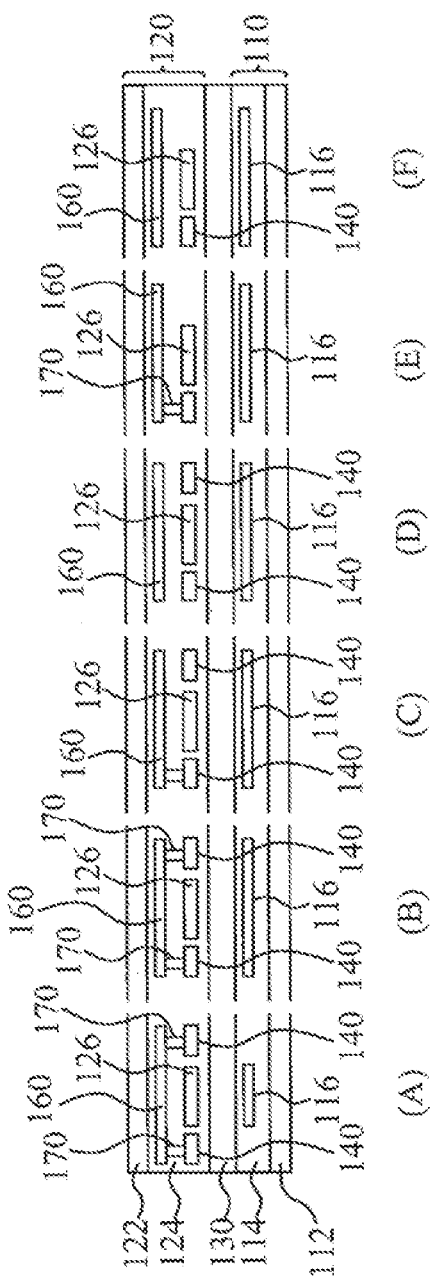
FIG. 12 shows six different possible embodiments of a transmission line structure according to the present disclosure.
Figure 13:
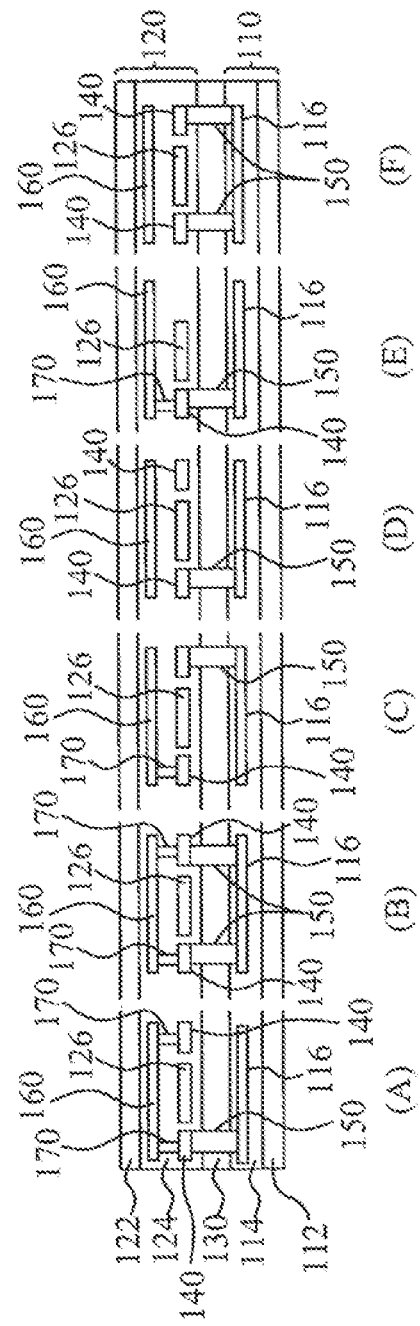
FIG. 13 shows six different possible embodiments of a transmission line structure according to the present disclosure.

FIG. 9 shows an embodiment of a transmission line structure 500 which is variation of the microstrip shown in FIG. 1. A coplanar ground strip 140 is disposed on one side of and spaced apart from the signal transmission line 126 as shown in FIG. 9.

FIGS. 10-13 show a total of twenty-four different possible embodiments of transmission line structures according to the present disclosure which is formed by using the stacked die approach described herein. Each of FIGS. 10, 11, 12, and 13 show six different variations or embodiments identified as (A) to (F) of possible microstrip, stripline, or waveguide configurations which are constructed according to the present disclosure utilizing two stacked dies 110 and 120 as described herein. Embodiments (A) to (F) of FIGS. 10-13 contain a variety of different conductive signal transmission lines 126, ground planes 116 and 160, ground strips 140, vias 170, and microbumps 150 which are arranged as shown. The relative widths and positioning of these foregoing conductive elements with respect to each other as shown, and include various symmetrical and asymmetrical arrangements. It will be appreciated that numerous possible embodiments of transmission line structures beyond those examples shown herein can be formed by using the stacked die approach to obtain the device configuration desired. The transmission line structures and elements shown in FIGS. 10-13 are provided individually or combined in various arrangements in any number of possible combinations of structures in various embodiments depending on the intended application.

Placement of the ground plane 116 on one die 110 and the signal transmission line 126 on a second different die 120 advantageously removes some of the space requirements and design constraints associated with trying to fit both the ground plane and signal transmission line in the CMOS substrate of a single die.

An exemplary method for forming a transmission line structure according to the present disclosure is provided. In one embodiment, with reference to FIG. 1, the method includes providing a first die 110, forming an electrical insulating layer 114 on the die, and forming a ground plane 116 on the insulating layer 114. The method further includes providing a second die 120, depositing an electrical insulating layer 124 on the die, and forming a signal transmission line 126 on the insulating layer 124.

The method continues by inverting the second die 120 and positioning die 120 in spaced apart relationship to the first die 110 so that the signal transmission line 126 faces the ground plane 116 of first die 110. Die 120 is separated from die 110 by a gap measured by a distance D.

The method next continues by injecting or adding underfill 130 between dies 110 and 120. The underfill 130, if provided in liquid form, flows between the dies and any conductive or other structures disposed in the gap between the dies. Finally, if a liquid underfill 130 is used, the underfill is cured and hardened by any suitable means to bond the first and second dies 110, 120 together including ultraviolet means.

FIG. 15 is a cross-sectional side view of another possible embodiment of a transmission line structure having metal conductive interconnect routings 250 disposed in die 110 within dielectric layer 114 beneath the ground plane 116. Dielectric layer 114 therefore is a metal-containing layer in this embodiment. The interconnect routings 250 are spaced apart and electrically isolated from ground plane 116 as shown. In some embodiments, the microbump 150 array shown in FIG. 16 is formed on the interconnect routings 250 as shown in FIG. 15 which includes bump pads in various embodiments for the microbumps.

According to one embodiment of the present disclosure, a semiconductor transmission line structure includes a first die including a first substrate, a first insulating layer formed on the first substrate, and a ground plane formed on the first insulating layer. The structure further includes a second die including a second substrate, a second insulating layer formed on the second substrate, and a signal transmission line formed on the second insulating layer, wherein the second die being stacked above and spaced apart from the first die. An underfill is disposed between the ground plane of the first die and the signal transmission line of the second die. In some embodiments, the first insulating layer of the first die is a metal layer containing electrically conductive metal interconnects interspersed with inter-metal dielectric layers.

In another embodiment according to the present disclosure, a semiconductor transmission line structure includes an interposer including a ground plane or signal transmission line formed thereon, and a die including a substrate, an insulating layer formed on the substrate, and one of a ground plane or signal transmission line not included in the interposer being formed on the insulating layer. The die is stacked above and spaced apart from the interposer. An electrically insulating underfill is disposed between the ground plane and the signal transmission line and fills a space between the interposer and die.

In one embodiment according to the present disclosure, a method is provided for forming a semiconductor transmission line structure. The method includes: forming a first ground plane on or in a first die; forming a signal transmission line on or in a second die; holding the first and second dies in spaced apart relationship to form a gap therebetween; and filling the gap with an insulating underfill material. In some embodiments, the method may further include forming a ground strip on either lateral side of the signal transmission line, forming a second ground plane above the signal transmission line, forming vias between the second ground plane and ground strips, and/or forming microbumps between the ground strips and first ground plane.

While the foregoing description and drawings may represent exemplary embodiments of the present disclosure, it will be understood that various additions, modifications and substitutions are possible without departing from the spirit and scope and range of equivalents of the accompanying claims. In particular, it will be clear to those of ordinary skill in the art that embodiments or elements of present disclosure can be embodied in other forms, structures, arrangements, proportions, sizes, and with other elements, materials, and components, without departing from the spirit or characteristics thereof. One of ordinary skill in the art will further appreciate that embodiments of the present disclosure can be used with many modifications of structure, arrangement, proportions, sizes, materials, and components and otherwise, used in the practice of various embodiments of the disclosure, which are particularly adapted to specific environments and operative requirements without departing from the principles of the present disclosure. In addition, numerous variations in the exemplary methods and processes described herein can be made without departing from the spirit of the disclosure. The presently disclosed embodiments are therefore to be considered in all respects as illustrative and not restrictive, the scope of various embodiments of the disclosure being defined by the appended claims and equivalents thereof, and not limited to the foregoing description or embodiments. Rather, the appended claims should be construed broadly, to include other variants and embodiments of the disclosure, which can be made by those of ordinary skill in the art in the art without departing from the scope and range of equivalents of the disclosure.

What is claimed is:

1. A semiconductor transmission line structure comprising:
   a first die including a first substrate having active devices, a first insulating layer formed on the first substrate, and a ground plane formed on the first insulating layer;
   a second die including a second substrate having active devices, a second insulating layer formed on the second substrate, and a signal transmission line formed on the second insulating layer, the second die being stacked above and spaced apart from the first die; and
   an underfill disposed between the ground plane of the first die and the signal transmission line of the second die, wherein the ground plane and the signal transmission line are separated by, and at least partially embedded inside, the underfill.

2. The transmission line structure of claim 1, wherein the first insulating layer of the first die is a metal-containing layer including electrically conductive metal interconnects and inter-metal dielectric layers.

3. The transmission line structure of claim 1, wherein the ground plane is disposed on top of the first insulating layer of the first die.

4. The transmission line structure of claim 1, wherein the signal transmission line is disposed on top of the second insulating layer of the second die.

5. The transmission line structure of claim 1, wherein the ground plane and signal transmission line each have a lateral width, the width of the ground plane being at least 1.5 times the width of the signal transmission line.

6. The transmission line structure of claim 1, wherein the underfill layer is made of an electrically insulating dielectric material.

7. The transmission line structure of claim 1, wherein the ground plane and signal transmission line are at least partially embedded in the underfill.

8. The transmission line structure of claim 1, further comprising a first ground strip formed on the second insulating layer of the second die, the first ground strip being coplanar with the signal transmission line and laterally spaced apart from the signal transmission line.

9. The transmission line structure of claim 8, further comprising a first microbump extending between the first ground strip and ground plane, the first microbump connected to the first ground strip and the ground plane.

10. The transmission line structure of claim 8, further comprising a second ground strip formed on the second insulating layer of the second die, the second ground strip being coplanar with the signal transmission line and laterally spaced apart from the signal transmission line on a side opposite the first ground strip, wherein the first and second ground strips and signal transmission line form a coplanar waveguide.

11. The transmission line structure of claim 1, further comprising a second ground plane formed in the second insulating layer of the second die, the second ground plane being spaced vertically apart from the signal transmission line.

12. The transmission line structure of claim 11, further comprising a first microbump connected to the second ground plane and extending vertically towards the signal transmission line, the first microbump terminating at a point spaced laterally apart from signal transmission line.

13. A semiconductor transmission line structure comprising:
   an interposer including a ground plane or signal transmission line formed thereon;
   a die including a substrate, an insulating layer formed on the substrate, and one of a ground plane or signal transmission line not included or connected to a conductor included in the interposer being formed on the insulating layer, and the other of the ground plane or the signal transmission line not included or connected to a conductor included in the die, the die being stacked above and spaced apart from the interposer; and an electrically insulating underfill disposed between the ground plane and the signal transmission line and filling a space between the interposer and die, wherein the ground plane and the signal transmission line are separated by, and at least partially embedded inside, the underfill.

14. The transmission line structure of claim 13, wherein the insulating layer of the die is a metal-containing layer including electrically conductive metal interconnects and intermetal dielectric layers.

15. The transmission line structure of claim 13, wherein the ground plane and signal transmission line each have a lateral width, the width of the ground plane being at least 1.5 times the width of the signal transmission line.

16. The transmission line structure of claim 13, wherein the underfill layer is made of an electrically insulating dielectric material.

17. The transmission line structure of claim 13, further comprising a first ground strip formed coplanar with and laterally spaced apart from the signal transmission line.

18. The transmission line structure of claim 17, further comprising a first microbump extending between the first ground strip and ground plane, the first microbump connected to the first ground strip and the ground plane.

19. The semiconductor transmission line structure of claim 1, wherein the signal transmission line is a microstrip configured to convey microwave frequency signals.

20. The semiconductor transmission line structure of claim 19, wherein the ground plane is located in a top metal-containing layer of the first die, and the top surface of ground plane is exposed above a top dielectric layer of the first die.

21. The semiconductor transmission line structure of claim 20, wherein the signal transmission line is located in a top metal-containing layer of the second die, and the top surface of signal transmission line is exposed above a top dielectric layer of the second die.

22. The semiconductor transmission line structure of claim 19, wherein the signal transmission line is insulated from the ground plane by the underfill, without a conductive coupling between the ground plane and the second die, and without a conductive coupling between the signal transmission line and the first die.

23. The semiconductor transmission line structure of claim 13, wherein the signal transmission line is a microstrip configured to convey microwave frequency signals.

24. The semiconductor transmission line structure of claim 23, wherein the ground plane is located in a top metal-containing layer of the interposer or die, and the top surface of ground plane is exposed above a top dielectric layer of the interposer or die.

25. The semiconductor transmission line structure of claim 24, wherein the signal transmission line is located in a top metal-containing layer of the die or interposer, and the top surface of signal transmission line is exposed above a top dielectric layer of the die or interposer.

* * * * *